United States Patent [19]

Lee et al.

[11] Patent Number: 5,805,498

[45] Date of Patent: Sep. 8, 1998

[54] NONVOLATILE SEMICONDUCTOR MEMORY DEVICE HAVING A SENSE AMPLIFIER COUPLED TO MEMORY CELL STRINGS WITH REDUCED NUMBER OF SELECTION TRANSISTORS

[75] Inventors: Seung-Keun Lee; Dong-Gi Lee, both of Seoul, Rep. of Korea

[73] Assignee: Samsung Electronics, Co., Ltd., Suwon, Rep. of Korea

[21] Appl. No.: 715,577

[22] Filed: Sep. 19, 1996

[30] Foreign Application Priority Data

Sep. 19, 1995 [KR] Rep. of Korea ................. 1995/30742

[51] Int. Cl.[6] ................................................. G11C 16/04
[52] U.S. Cl. ................................. 365/185.17; 365/185.2
[58] Field of Search ............................ 365/185.2, 185.17, 365/185.22

[56] References Cited

U.S. PATENT DOCUMENTS

| | | | |
|---|---|---|---|
| 5,022,009 | 6/1991 | Terada et al. | 365/185.21 |
| 5,446,690 | 8/1995 | Tanaka et al. | 365/185.25 |
| 5,521,864 | 5/1996 | Kobayashi et al. | 365/185.22 |
| 5,559,737 | 9/1996 | Tanaka et al. | 365/185.25 |

*Primary Examiner*—David C. Nelms
*Assistant Examiner*—Andrew Q. Tran
*Attorney, Agent, or Firm*—Marger, Johnson, McCollom, & Stolowitz P.C.

[57] ABSTRACT

A nonvolatile semiconductor memory device has one sense amplifier coupled to multiple bit lines and coupled to multiple memory cell strings to reduce the number of selection transistors per cell string and improve density. The invention is most useful in a NAND-type flash memory device.

2 Claims, 2 Drawing Sheets

NONVOLATILE SEMICONDUCTOR MEMORY DEVICE HAVING A SENSE AMPLIFIER COUPLED TO MEMORY CELL STRINGS WITH REDUCED NUMBER OF SELECTION TRANSISTORS

BACKGROUND OF THE INVENTION

1. Field of the Invention

The present invention relates to a nonvolatile semiconductor memory device, and more particularly, to a circuit for connecting a selected string cell and a reference cell to each bit line in a nonvolatile semiconductor memory device in which one sense amplifier is deployed for each four-cell string. The present application is based upon Korean Application No. 30740/1995, which is incorporated herein by reference. The Korean application was filed Sep. 19, 1995 by Samsung Electronics Co., Ltd. and is entitled NONVOLATILE SEMICONDUCTOR MEMORY DEVICE.

2. Description of the Related Art

Generally, it is known that a nonvolatile semiconductor memory device, e.g., a flash EEPROM with NAND-structured cell array, occupies less silicon area than a memory device with a NOR-structured cell array. FIG. 1 shows a shared and folded bit line structure including cell strings and reference cell strings of a known nonvolatile semiconductor memory device. In the shared and folded bit line structure, two cell strings share one bit line and two bit lines are connected to one sense amplifier in a folded arrangement.

Referring again to FIG. 1, it illustrates a memory configuration including two bit lines BL1 and BL2, four cell strings SC1 to SC4, two reference cell strings RC1 and RC2 and a sense amplifier 10. Each of the reference cell strings provides a predetermined reference voltage to the sense amplifier when a cell string coupled to the other bit line is selected. Each cell string is constructed of a plurality of memory cell transistors (MC1, MC2, . . . ), two string selection transistors ST1 and ST2, and two ground selection transistors GT1 and GT2.

In cell strings SC1 and SC2, connected to bit line BL1 in common, the string selection transistors are arranged to respond to string selection signals SSL1 and SSL2 in like fashion. The SC1 and SC2 cell string ground selection transistors, however, are activated in a complementary manner responsive to ground selection signals GSL1 and GSL2. The same arrangement can be observed in cell strings SC3 and SC4. To illustrate operation, assume that, for example, cell string SC1 is selected and one of cell transistors is turned on. The SSL1, SSL2, GSL1 and GSL2 signals are at Vss (ground potential), Vcc (supply voltage level), Vss and Vcc, respectively. It is well known that word line voltages corresponding to unselected cell transistors are assigned to pass voltages, i.e., Vcc, so that the selected bit line BL1 assumes a voltage level responsive to the state of the selected cell transistor. At the same time, reference selection signals REF1 and REF2 are driven to Vcc and Vss, respectively, so as to activate reference cell string RC2 which is connected to bit line BL2 operating as a reference bit line for sense amplifier 10. Cell strings SC3 and SC4 are inactive. A sensed voltage level on the bit line BL1 and the reference voltage on the bit line BL2 are applied to the sense amplifier 10 in order to execute an sensing operation. On the other hand, when SC3 or SC4 are active, BL1 acts as a reference bit line, while BL2 responds to the voltage of a selected cell transistor in one of cell strings SC3 and SC4, in the same manner as described above.

As described above and shown in FIG. 1, since one out of four cell strings is to be selected for one sense amplifier accompanied by two bit lines, each cell string needs four selection transistors comprising two string selection transistors and two ground selection transistors. The number of selection transistors per each cell string may be even greater in higher density memory devices, thus degrading the effective level of integration and increasing the manufacturing cost per memory cell.

SUMMARY OF THE INVENTION

Accordingly, it is an object of the present invention to provide a nonvolatile semiconductor memory device capable of overcoming the foregoing conventional problems.

It is another object of the present invention to reduce the number of selection transistors per cell string in a nonvolatile semiconductor memory device.

It is further object of the present invention to provide a nonvolatile semiconductor memory device capable of improving the mechanical efficiency of a circuit arrangement, including the use of plural cell strings, shared bit lines and sense amplifier.

To achieve these and other objects, there is disclosed a nonvolatile semiconductor memory device having a sense amplifier for detecting a voltage difference between a selected bit line and a reference bit line. The sense amplifier has a pair of input terminals, and one input terminal is coupled to one bit line at a time which is selected from a plurality of bit lines each coupled to a corresponding one of a first plurality of cell strings. The other sense amplifier input terminal is coupled to one reference bit line at a time which is selected from a plurality of reference bit lines coupled to a corresponding second plurality of reference cell strings. Switching circuitry provides for applying a selected one of the first plurality of bit lines to the first input as a reference bit line, and coupling a selected one of the second plurality of bit lines to the other input as a data bit line when one of the second set of cell strings is selected for a memory operation. The circuit has the advantage of requiring only one sense amplifier for four cell strings, and reducing the number of select transistors.

BRIEF DESCRIPTION OF THE DRAWINGS

A more complete appreciation of this invention, and many of the attendant advantages thereof, will be readily apparent as the same becomes better understood by reference to the following detailed description of a preferred embodiment when considered in conjunction with the accompanying drawings, in which like reference symbols indicate the same or similar elements or components, and wherein.

DETAILED DESCRIPTION OF THE PREFERRED EMBODIMENT

Figure 1:
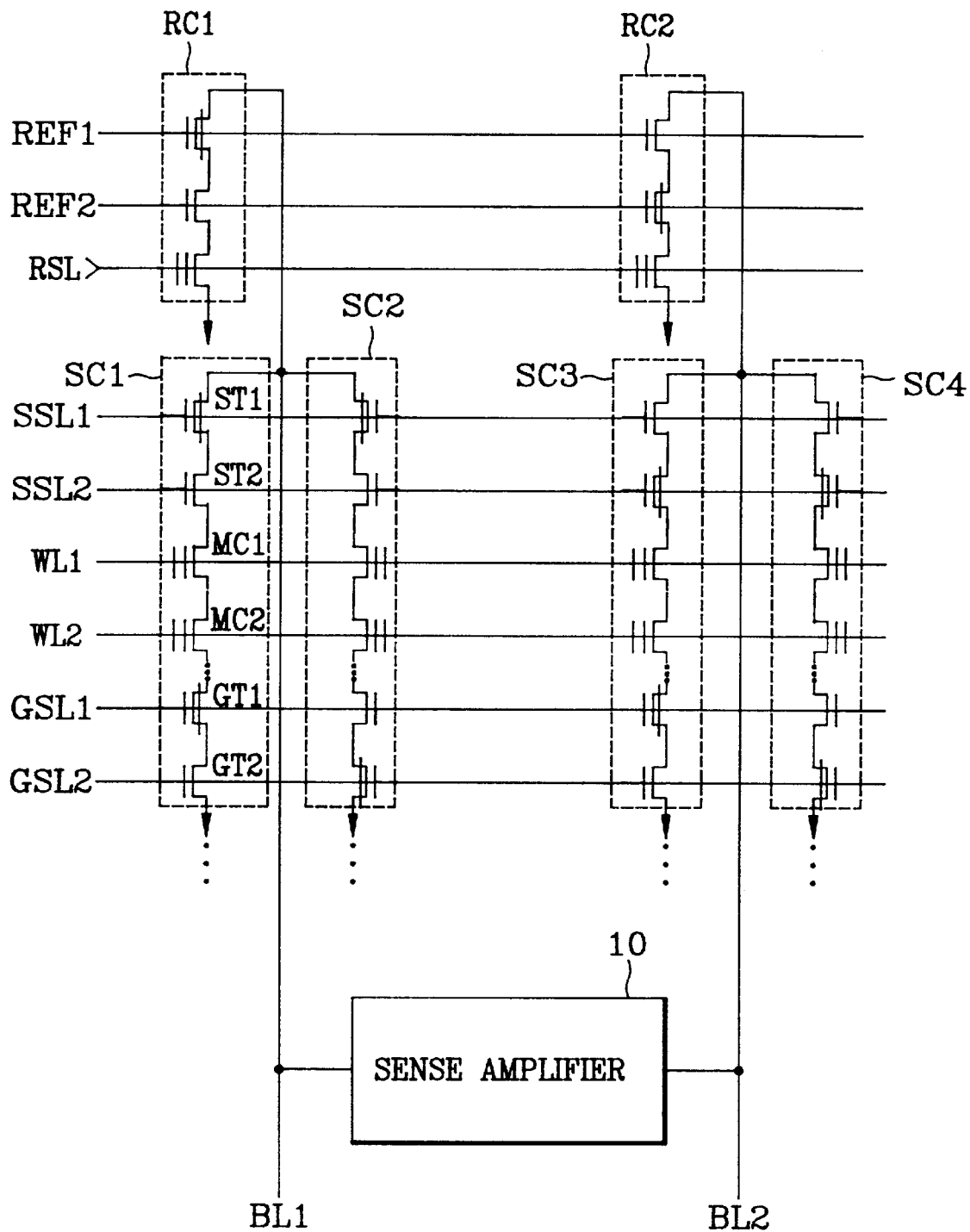
FIG. 1 is a circuit diagram illustrating a configuration of a conventional nonvolatile semiconductor memory cell.
Figure 2:
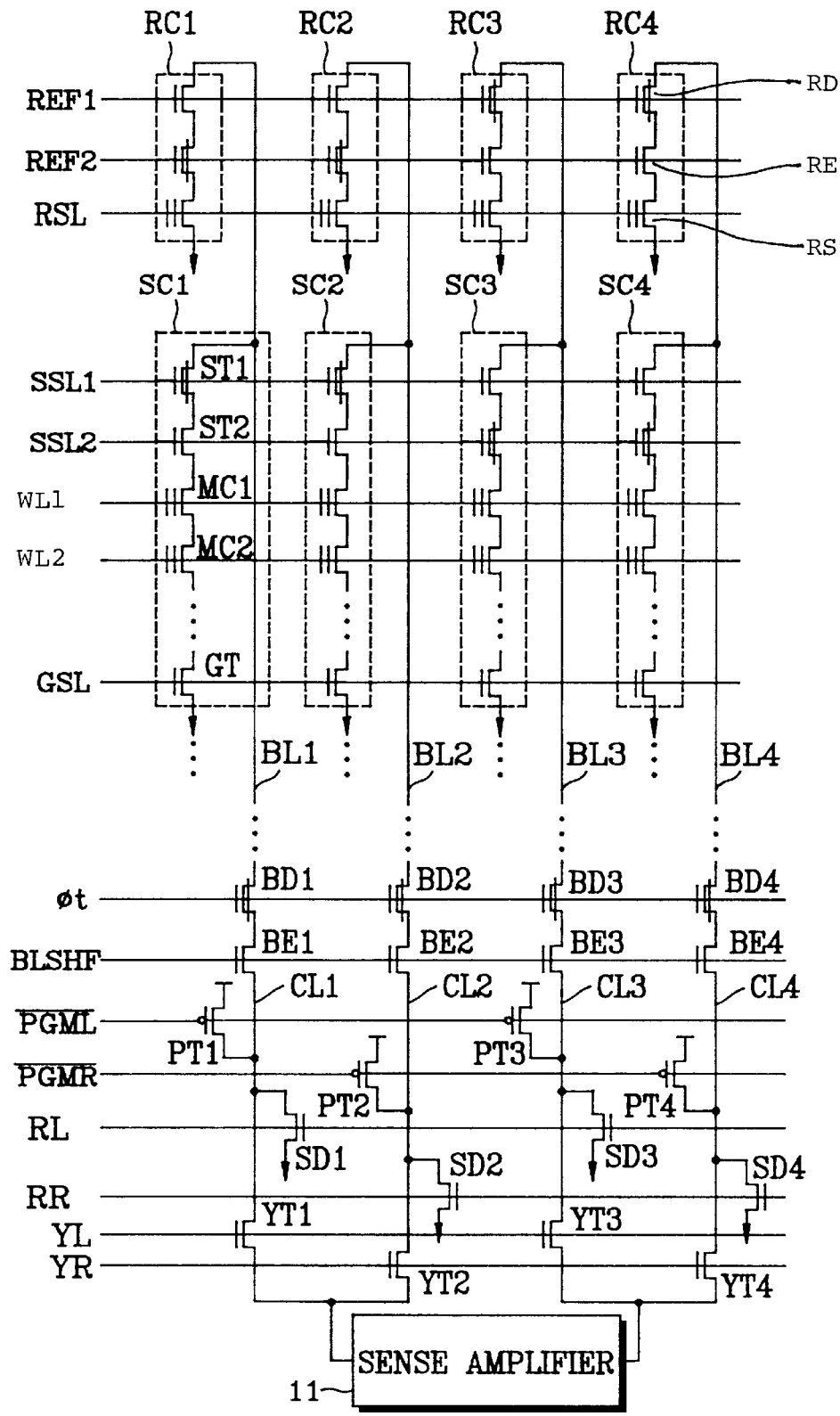
FIG. 2 is a circuit diagram illustrating a configuration of a nonvolatile semiconductor memory cell in accordance with the present invention.

Hereinafter, an embodiment of a preferred configuration and operation of the present invention will be described in detail with reference to the attached figures. A circuit as shown in FIG. 2 is provided in order to reduce the number of selection transistors per cell string in a NAND-type flash memory in accordance with the present invention. Referring to FIG. 2, one sense amplifier 11 (page buffer) is arranged to correspond with four bit lines BL1 to BL4. Each bit line is coupled to one reference cell string and plural cell strings, although for simplicity of illustration only one cell string is shown explicitly for each bit line, the others being indicated by a broken line denoting respective connections of additional cell strings connected to the same bit line.

Referring for example to bit line BL1, a reference cell string RC1 is constructed of an enhancement-type reference cell transistor RE, a depletion-type reference cell transistor RD and a reference ground selection transistor RS, all connected in series between BL1 and ground. Gates of the transistors RE, RD and RS are coupled to first reference signal REF1, second reference signal REF2 and reference selection signal RSL, respectively. Reference cell string RC2 has the same arrangement as that of RC1. As for strings RC3 and RC4, the location of the enhancement-type and depletion-type reference cell transistors in the serial loop between the corresponding bit lines and ground is reversed. In RC3 (or RC4), a depletion-type reference cell transistor is first connected to bit line BL3 (or BL4).

Cell string SC1 (SC2, SC3 or SC4) has two string selection transistors ST1 (depletion-type) and ST2 (enhancement type), and one ground selection transistor GT. For the purpose of selecting the cell strings and the reference cell strings reciprocally and alternatively, while depletion-type string selection transistors of SC1 and SC2 are controlled by the first string selection signal SSL1, in cell strings SC3 and SC4, the selection signal SSL1 is commonly applied to the gates of enhancement-type string selection transistors. A second string selection signal SSL2 is applied to gates of enhancement-typed string selection transistors of SC1 and SC2, and also coupled to gates of depletion-type string selection transistors of SC3 and SC4. Ground selection transistors of the cell strings SC1 to SC4 are controlled by a common ground selection signal GSL for controllably connecting the cell strings to the ground.

Multiple cell transistors in each string, like MC1, MC2, . . . in SC1, are serially connected between the second string selection transistor (enhancement-type string selection transistor in SC1 and SC2, or depletion-type string selection transistor in SC3 and SC4) and the ground. It should be noted that the enhancement-type and depletion-type selection transistors can be reversed, in both the reference cell strings and the memory cell strings, as may be advantageous in a specific circuit design.

To each bit line, high voltage blocking transistors BD1 (depletion-type) and BE1 (enhancement-type) for BL1, BD2 and BE2 for BL2, BD3 and BE3 for BL3, and BD4 and BE4 for BL4, respectively, are provided in serial connection in order to prevent a high voltage retransfer toward the cell strings after transferring read data to the sense amplifier 11. The depletion-type blocking transistors BD1 to BD4 are controlled by a blocking signal φt and the enhancement-type blocking transistors BE1 to BE4 are controlled by blocking signal BLSHF, the φt and BLSHF signals being at power supply voltage level during a read operation.

Between the blocking transistors and the sense amplifier 11, additional transistors are provided for controlling interactions with the bit lines BL1, to BL4 and sense amplifier 11 as follows. The lines between the blocking transistor and the sense amplifier will be referred to as column lines CL1 to CL4. Thus, the column lines CL1 to CL4 are connected to the bit lines BL1 to BL4 through the blocking transistors BD1/BE1 to BD4/BE4, respectively. Bit line precharge transistors (PMOS transistors) PT1 to PT4 are connected between the power supply voltage and column lines CL1 to CL4, respectively. Transistors PT1 and PT3 are controlled by program control signal PGML/ and transistors PT2 and PT4 are controlled by program signal PGMR/ (a virgule is used herein where a horizontal bar appears over the corresponding signal name in the drawing indicating an active low signal).

Additionally, ground shielding transistors SD1 to SD4 are provided between column lines CL1 to CL4, respectively, each shielding transistor having a gate coupled to receive a read control signals RL or RR. The RL signal is applied to the gates of SD1 and SD3 for CL1 and CL3, and the RR signal is applied to the gates of SD2 and SD4 for CL2 and CL4. Connecting the column lines to the sense amplifier 11 is conducted by column selection transistors YT1 to YT4 interposed therebetween.

Similar to the precharge and shielding transistors, the column selection transistors receive control signals YL and YR. YL controls YT1 and YT3, for connecting CL1 and CL3 to the first and second inputs of the sense amplifier 11, while YR controls YT2 and YT4, for connecting CL2 and CL4 to the first and second inputs of the sense amplifier 11, respectively. Below the column selection transistors, the column lines are wired in pairs and applied to the input terminals of the sense amplifier 11. Thus CL1 and CL2 are connected to the first input, and CL3 and CL4 are connected to the other input. For the purpose of maintaining the voltage level of an unselected bit line which is not electrically connected, for a decoupling effect between bit lines in a specific voltage level (Vcc or Vss) during a reading operation, these shielding transistors are used. The shielding transistor s can provide a shielding line for inhibiting the coupling phenomenon between two bit lines during a reading operation.

To further illustrate operation, assume the cell string SC1 is connected to the bit line BL1, for example, and the reference cell string RC3 is electrically connected to the bit line BL3. Vcc (power supply voltage) is applied to the lines SSL2, GSL and REF2, and Vss (ground voltage) is applied to the lines REF1 and SSL1. RSL is asserted (Vcc) so the reference strings are coupled to ground. The cell strings SC3 and SC4 are disconnected from the bit lines BL3 and BIA by selection transistors, and the cell strings SC1 and SC2 are electrically connected to bit lines BL1 and BL2, respectively. At the same time, the reference cell strings RC3 and RC4 are electrically connected to the bit lines BL3 and BL4, respectively. Meanwhile, only one bit line out of the pair BL1 and BL2 corresponding to one of the cell strings SC1 or SC2 is connected to one input terminal of the sense amplifier 11 through the corresponding column selection transistor YT1 or YT2. Similarly, only one reference bit line of the BL3, BL4 pair is connected through the column select transistors to the other input terminal of the sense amplifier.

The column selection transistors are turned on, or turned off, responsive to the column selection signals YL and YR so as to connect only one of two bit lines for the cell strings and one of two bit lines for the reference cell strings, to the sense amplifier, as described above. For example, when Vcc is applied to the signal YL and Vss to the signal YR, the bit lines BL1 and BL3 (column lines CL1,CL3) are switched to the sense amplifier so that the data voltage from SC1 and the reference voltage from RC3 are applied to the sense amplifier. Thus, while the operation, BL1, and BL3 may be referred to as a data bit line and a reference bit line, respectively. The sense amplifier senses potential difference between the data bit line and the reference bit line connected in the foregoing manner.

Accordingly, in the case of a circuit having the 4 string cell/1 sense amplifier structure, the number of select transistors can be reduced by one with respect to each cell string. Accordingly, the invention provides for reducing the entire area of a memory chip and also attaining a decoupling effect between bit lines. It should be understood of course that the present invention is not limited to the particular embodiment disclosed herein as the best mode contemplated for carrying out the present invention. Rather, the scope of the invention is as defined in the appended claims and equivalents thereof.

what is claimed is:

1. A semiconductor nonvolatile memory device comprising:
    a sense amplifier having first and second inputs;
    a first bit line coupled to one or more cell strings;
    a second bit line coupled to one or more cell strings;
    control means for alternatively connecting a selected one of the first and second bit lines to the first input to the sense amplifier as one of either a data bit line or a reference bit line;
    a third bit line coupled to one or more cell strings;
    a fourth bit line coupled to one or more cell strings; wherein
        said control means includes means for alternatively connecting a selected one of the third and fourth bit lines to the second input to the sense amplifier as the alternative one of either a data bit line or a reference bit line, so that the sense amplifier detects a potential difference between the selected data bit line and the selected reference bit line to conduct a memory read operation;
    wherein said control means for connecting the selected data bit line and the selected reference bit line to the sense amplifier includes a respective column select transistor interposed between each of the first through fourth bit lines and the sense amplifier; and
    wherein the column select transistors comprise enhancement-type MOS transistors each having a control gate and the control means further includes:
        a first column select control signal coupled to the control gates of the column select transistors interposed between the first and third bit lines and the sense amplifier; and
        a second column select control signal coupled to the control gates of the column select transistors interposed between the second and fourth bit lines and the same amplifier, the first and second column select control signals being mutually exclusive.

2. A semiconductor nonvolatile memory device comprising:
    a sense amplifier having first and second inputs;
    a first bit line coupled to one or more cell string;
    a second bit line coupled to one or more cell strings;
    control means for alternatively connecting a selected one of the first and second bit lines to the first input to the sense amplifier as one of either a data bit line or a reference bit line;
    a third bit line coupled to one or more cell strings;
    a fourth bit line coupled to one or more cell strings; wherein
        said control means includes means for alternatively connecting a selected one of the third and fourth bit lines to the second input to the sense amplifier as the alternative one of either a data bit line or a reference bit line, so that the sense amplifier detects a potential difference between the selected data bit line and the selected reference bit line to conduct a memory read operation; and
    wherein each of the memory cell strings consists of only three select transistors, namely two selection transistors each responsive to a corresponding selection signal and a single ground selection transistor responsive to a common ground selection signal.

* * * * *

UNITED STATES PATENT AND TRADEMARK OFFICE
CERTIFICATE OF CORRECTION

PATENT NO.    : 5,805,498
DATED         : September 8, 1998
INVENTOR(S)   : Seung-Keun Lee et al.

It is certified that error appears in the above-identified patent and that said Letters Patent is hereby corrected as shown below:

Column 4,
Line 40, "BIA" should read -- BL4 --

Column 6,
Line 8, "the same amplifier" should read -- the sense amplifier --.

Signed and Sealed this

Eighth Day of October, 2002

Attest:

Attesting Officer

JAMES E. ROGAN
Director of the United States Patent and Trademark Office